United States Patent
Kim

(10) Patent No.: US 9,696,367 B2
(45) Date of Patent: Jul. 4, 2017

(54) APPARATUS AND METHOD OF FAULT DETECTION AND LOCATION DETERMINATION

(75) Inventor: Charles J. Kim, Annandale, VA (US)

(73) Assignee: Howard University, Washington, DC (US)

( * ) Notice: Subject to any disclaimer, the term of this patent is extended or adjusted under 35 U.S.C. 154(b) by 1015 days.

(21) Appl. No.: 13/469,208

(22) Filed: May 11, 2012

(65) Prior Publication Data
US 2013/0304406 A1 Nov. 14, 2013

(51) Int. Cl.
*G01R 31/08* (2006.01)

(52) U.S. Cl.
CPC .................. *G01R 31/083* (2013.01)

(58) Field of Classification Search
CPC .................................... G01R 31/083
USPC .............................................. 702/59
See application file for complete search history.

(56) References Cited

U.S. PATENT DOCUMENTS

| | | | |
|---|---|---|---|
| 4,996,624 A | 2/1991 | Schweitzer, III | |
| 6,097,280 A | 8/2000 | Takeda et al. | |
| 6,198,401 B1 | 3/2001 | Newton et al. | |
| 6,476,613 B2 * | 11/2002 | Saha et al. | 324/522 |
| 8,159,229 B2 | 4/2012 | Akke et al. | |
| 2005/0163308 A1 | 7/2005 | Smith et al. | |
| 2006/0097728 A1 * | 5/2006 | Saha et al. | 324/525 |
| 2006/0142964 A1 * | 6/2006 | Saha et al. | 702/66 |
| 2011/0178741 A1 * | 7/2011 | Saha | 702/59 |
| 2012/0063040 A1 | 3/2012 | Rostron | |
| 2012/0086459 A1 | 4/2012 | Kim | |
| 2012/0112758 A1 | 5/2012 | Weems, II et al. | |

FOREIGN PATENT DOCUMENTS

| | | |
|---|---|---|
| JP | 2006-505768 A | 2/2006 |
| WO | 0191265 | 11/2001 |
| WO | 2004/001431 A1 | 12/2003 |

OTHER PUBLICATIONS

International Search Report and Written Opinion dated Sep. 24, 2013 (PCT/US2013/039722) 11 pages.
International Search Report dated Mar. 2, 2012 relating to PCT/US2011/055582.
Ying-Hong Lin, Chih-Wen Liu, Ching-Shan Chen, A new PMU-Based Fault Detection/Location Technique for Transmission Lines With Consideration of Arcing Fault Discrimination, (8 pages), 2004.

(Continued)

*Primary Examiner* — Ricky Ngon
(74) *Attorney, Agent, or Firm* — Fitch, Even, Tabin & Flannery LLP

(57) ABSTRACT

A distance from a measurement point to a fault in a three-phase circuit is determined. The measurement point is located at an output of a power sub-station and the three phase circuit has a loop circuit having an associated net fault line current and a ground current. A derivative of the net fault line current of the loop circuit as measured from the measurement point is calculated. An uncompensated distance to the sub-cycle fault using at least the derivative of the net fault current is determined, and configured, to compensate for the ground current of the loop circuit. The compensation is applied to the uncompensated distance to produce a compensated distance to the sub-cycle fault.

10 Claims, 3 Drawing Sheets

(56) References Cited

OTHER PUBLICATIONS

Joe-Air Jiang, Jun-Zhe Yang, Ying-Hong Lin, Chih-Wen Liu, An Adaptive PMU Based Fault Detection/Location Technique for Transmission Lines-Part I (8 pages), 2000.
S. Horton and N. van Luijk, "Low voltage fault detection and localization using the Topas 1000 disturbance recorder," Electric Power Quality and Utilization Magazine, vol. 2, No. 1, pp. 27-32, 2006.
J. Livie, P. Gale, and A. Wang, "Experience with on-line low voltage cable fault location techniques in Scottish power," 19th International Conference on Electricity Distribution (CIRED), May 21-24, 2007. Vienna, Austria.
L. Kojovic and C. Williams, "Sub-cycle detection of incipient cable splice faults to prevent cable damage," Proc. IEEE Power Engineering Society Summer Meeting, 2000. vol. 2, pp. 1175-1180. Jul. 16, 2000-Jul. 20, 2000. Seattle, WA , USA.
M. McGranaghan, T. Short, D. Sabin, "Using PQ Monitoring Infrastructure for Automatic Fault Location," 19th International Conference on Electricity Distribution (CIRED), May 21-24, 2007. Vienna, Austria.
C. Kim, T. Bialek, M. Lehtonen, and M. F. Abdel-Fattah, "Location of Underground Cable Transitory Faults ," 2011 IPST Conference. Jun. 14-17, 2011, Delft, Netherlands.
C. Kim and T. Bialek, "Sub-Cycle Ground Fault Location—Formulation and Preliminary Results," IEEE 2011 IEEE Power Systems Conference & Exposition Mar. 20-23, 2011. Phoenix, AZ.
T. S. Sidhu and Z. Xu, "Detection of Incipient Faults in Distribution Underground Cables," IEEE Transactions on Power Delivery, vol. 25, No. 3, Jul. 2010 p. 1363.
D.L. Waikar et al., Fault Impedance Estimation Algorithm for Digital Distance Relaying, (9 pages), 1994.
Extended European Search Report issued in corresponding European Application No. 13787570.4 dated Mar. 17, 2016 (9 pages).
Office Action issued in corresponding Japanese Application No. 2015-511574 dated Mar. 6, 2017 and English translation of same (8 pages).

\* cited by examiner

APPARATUS AND METHOD OF FAULT DETECTION AND LOCATION DETERMINATION

FIELD OF THE INVENTION

This application relates fault detection and location determination systems.

BACKGROUND

Faults in electrical systems are of a variety of different types. For example, permanent faults are faults that physically always exist in the system. Intermittent faults are faults that physically exist at one moment, but may disappear at another moment. Various approaches have been used to detect the permanent faults only.

Intermittent faults do not produce post-fault steady-state behavior for very long. Instead, these faults quickly disappear shortly after a short-lived transient period without reaching a steady state. In fact, these faults may last only about one cycle length of time. For example, underground insulation breakdown intermittent faults (for underground cable) or overhead power lines typically last less than one cycle, most often for about ½ cycle or less. These sub-cycle faults, which may lead to permanent faults, need to be located before they can develop into permanent faults.

As mentioned, various approaches have been used to detect and locate permanent faults. Unfortunately, these conventional fault location approaches are incapable of locating sub-cycle faults. In fact and in most cases, sub-cycle faults are simply ignored by previous approaches. Therefore, determination of distance to such a sub-cycle intermittent fault is not even attempted.

Figure 1:
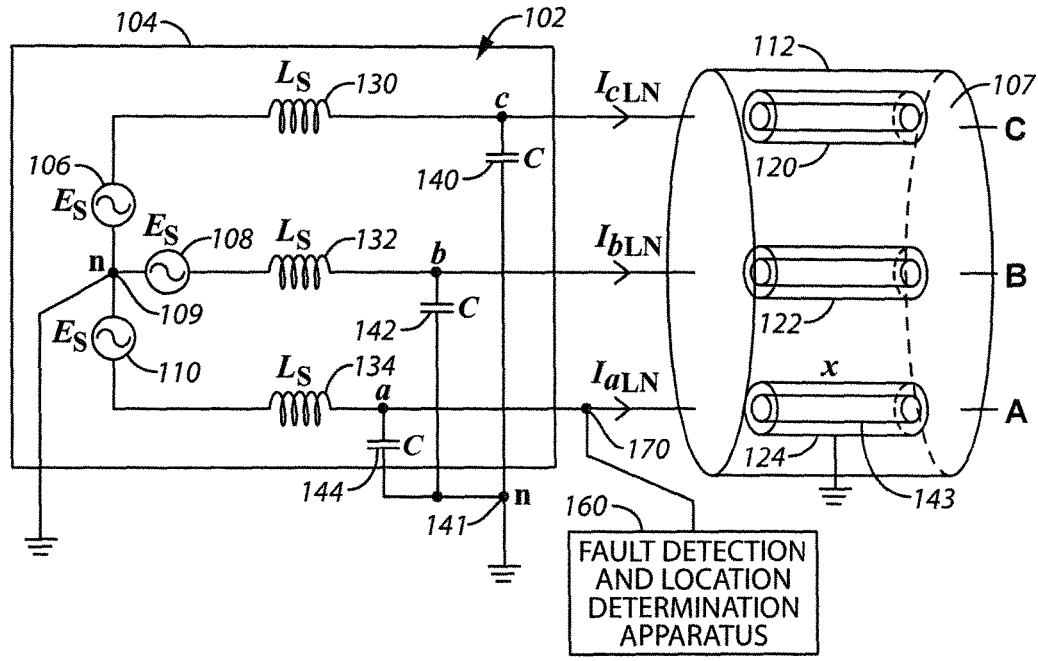
FIG. 1 comprises a diagram of a three-phase circuit including an apparatus for determining a fault location according to various embodiments of the present invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION OF THE PREFERRED EMBODIMENTS

In the approaches described herein, the presence and location of transient sub-cycle faults in electric circuits with a high capacitance, both self and mutual, is determined. By a transient sub-cycle fault it is meant that a fault appears then disappears after a very short duration of time, often less than one cycle, without reaching steady-state fault condition. In some aspects, these faults are present in underground or undersea cables. In one example, self-clearing sub-cycle faults may be present in cable circuits and are single phase-to-ground (SLG) faults.

In many of these embodiments, a distance from a measurement point to a fault in a three-phase circuit is determined. The measurement point is located at an output of a power sub-station and the three phase circuit has a loop circuit having an associated net fault line current and a ground current. A derivative of the net fault line current of the loop circuit (as measured from the measurement point) is calculated. An uncompensated distance to the sub-cycle fault using at least the derivative of the net fault current is determined. A compensation factor that is effective to compensate for the ground current of the loop circuit is configured in to the formula. The compensation factor is applied to the uncompensated distance to produce a compensated distance to the sub-cycle fault. The compensated distance may be measured in inductance units.

In other aspects, a net fault line current of the loop circuit may be measured at the measurement point. As used herein, net fault line current means the current component of a faulted power line with the supply power at the substation deactivated. In one approach, the net fault current is determined by subtracting the line current before the fault from the measured line current during the fault. The apparatus performing the measuring may be a part of an existing power management system deployed at power sub-station. In some aspects, the measured net fault line current is transmitted to a server via a network.

In still other aspects, a source inductance may be determined and the source inductance is measured from the measurement point looking back at the sub station. In some examples, the source inductance is determined according to at least one capacitance.

In still other aspects, the fault location accuracy is determined based at least upon the determined source inductance. In yet other aspects, the fault distance is displayed to a user. Both the distance and the accuracy of the calculation may be displayed to the user.

In others of these embodiments, an apparatus is configured to determine a distance from a measurement point to a fault in a three-phase circuit. The faulted circuit has a loop circuit with an associated ground current and net fault current. The apparatus includes a sensor and a processing device.

The sensor measures the line current from which the net fault line current of the loop circuit is calculated, and is deployed at the measurement point located at an output of a power sub-station. The processing device is coupled to the sensor and configured to calculate a derivative of the net fault line current and determine an uncompensated distance to the sub-cycle fault using the derivative. The processing device is further configured to compensate for the ground current and apply the compensation to the uncompensated distance to produce a compensated distance to the fault.

In some aspects, the apparatus is at least partially disposed with an existing power management system deployed at the power sub-station. In other aspects, the processing device is located at a different location than the sensor where the sensor and the processing device communicate via a communication network.

In yet other aspects, the processing device is further configured to determine a source inductance. The source inductance is measured from the measurement point looking back at the sub station. The source inductance is determined according to at least capacitance. The processing device is further configured to determine the fault location accuracy based at least upon the determined source inductance.

In still others of these embodiments, an apparatus is configured to determine a distance from a measurement point to a fault in a three-phase circuit. The faulted three-phase circuit has a loop circuit with an associated ground current and net fault current. The apparatus includes an interface and a processor.

The interface has an input and an output. The processor is coupled to the interface and configured to calculate a derivative of the net fault line current that is received at the input of the interface. The processor determines an uncompensated distance to the sub-cycle fault using the derivative. The processor is further configured to compensate for the ground current and apply the compensation to the uncompensated distance to produce a compensated distance to the fault for presentation at the output of the interface.

In some aspects, the apparatus is at least partially disposed with an existing power management system deployed at the power sub-station. In other examples, the apparatus communicates with a sensor at the measurement point via a communication network.

In yet other aspects, the processor is further configured to determine a source inductance. The source inductance is measured from the measurement point looking back at the sub station. In still other examples, the processor is further configured to determine a fault location accuracy based at least in part upon the determined source inductance.

Referring to FIG. 1, a three phase cable circuit 102 is connected to a substation 104 with phase cables 120, 122, and 124 inside a cable jacket 112. The cables 120, 122, and 124 run from the substation 104 (at connection points that are labeled a, b, and c) to a cable end 107 (at connection points labeled as A, 13, and C). The substation 104 has three phase sources 106, 108, and 110, each represented by an ideal source Es and source impedance Ls (labeled as 130, 132, and 143) in series, connected together at a neutral point 109 to form a balanced three-phase source system. The neutral point 109 is directly connected to the earth (or ground). A three-phase capacitor bank is connected to the three phase lines at a, b, and c, with phase capacitance of C (labeled as 140, 142, and 144) and its neutral point 141 directly attached to ground (e.g., the earth). The purpose of the capacitor bank is to improve the power factor of the load connected to the three phase circuit. A location 143 (labeled as x), between the substation and the cable end, is the point of cable insulation breakdown and of, thereafter, a self-clearing single phase to ground fault in the cable.

A fault detection and location determination apparatus 160 is coupled to the output of the substation at a point 170. It will be appreciated that this is only one location where the apparatus can be deployed and that it may be connected at other points as well. It will also be appreciated that the apparatus 160 may be configured in a wide variety of shapes, sizes, and configurations. For example, it may be a hand-held unit. It may also be a unit that is permanently located at the substation. It may include sensors and processing circuitry that determines the presence and location of a sub-cycle fault. Portions of the apparatus may also not physically reside at the output of the substation 104. In this respect, it may also include a sensor that communicates with a remotely located processing apparatus where the remotely located processing apparatus actually performs the fault determination and location determination calculations. The connection in such a case may be wired and/or wireless connection (e.g., via an internet connection). The apparatus 160 may also include user interfaces such as computer screens, terminals and the like to allow a user to see the existence of a fault and the location. Additionally, the apparatus 160 may communicate with other types of devices such as personal computers, cell phones, pagers, and so forth that may or may not be located at the immediate vicinity of the substation 104.

Figure 2:
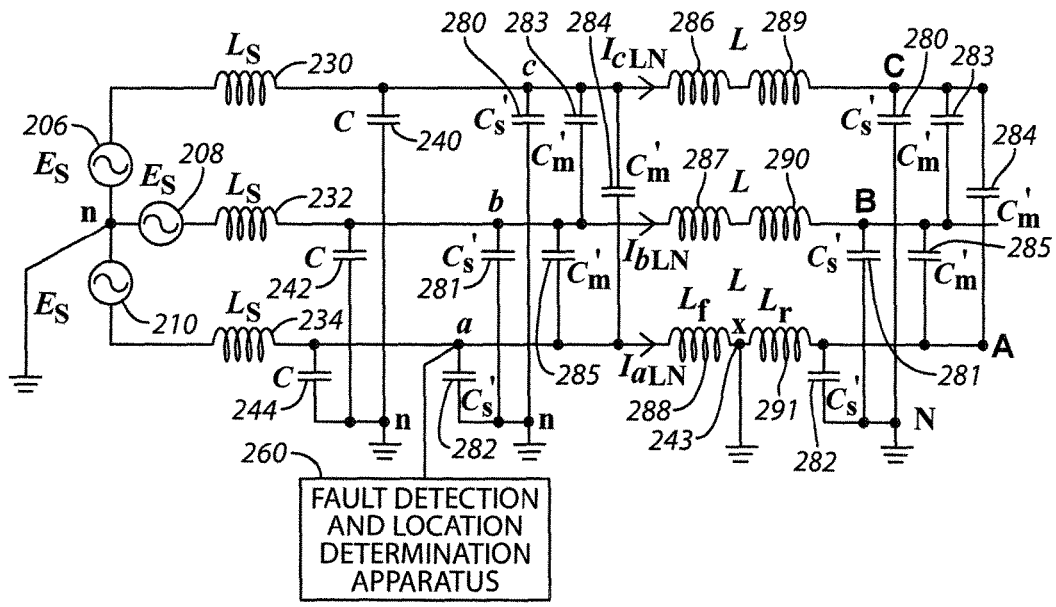
FIG. 2 comprises a diagram of an equivalent circuit of the three-phase circuit of FIG. 1 according to various embodiments of the present invention.

The three-phase cable circuit of FIG. 1 can be converted to an equivalent circuit using a general representation method of cable circuits. In this respect and as shown in FIG. 2, a cable section can be represented by a pi circuit, comprised of half the self-capacitance between a phase to the earth and half the mutual-capacitance between phases at one end, those of the other halves at the other end, and inductance connecting the two ends. It will be appreciated that as described herein, all resistive components are omitted in formula derivation. It will also be appreciated that this is one representation of an equivalent circuit and that other examples are possible.

Referring FIG. 2, the equivalent circuit of FIG. 1 is now described. Like-numbered elements of FIG. 1 correspond to like-numbered elements in FIG. 2. For example, element 104 in FIG. 1 corresponds to element 204 in FIG. 2. The three-phase substation sources 206, 208, and 210 are connected to the cable pi circuit, a part of which shows a temporary insulation failure condition 243 at location x in the phase a cable. Capacitive elements 280, 281, and 282 (labeled as the Cs' elements in the figure) represent the self-capacitance of the cable section. Capacitive elements 283, 284, and 285 (labeled as the Cm' elements in the figure) represent the mutual capacitance of the cable. It will be appreciated that each capacitive element in the figure is one half capacitance. For instance, each of the two elements labeled 283 is one-half the mutual capacitance).

The inductance of the cable L is divided into Lf elements 286, 287, and 288 and Lr elements 289, 290, and 291 by the fault location x to indicate the inductance from the substation to the fault and that from the fault to the cable end, respectively. In the healthy phases (in this example, phases b and c), their cable inductances are also divided into two, but only for illustration purpose, by the corresponding location of fault location x in phase a.

In one example, the three line currents, IalN, IblN, and IclN, are measured by substation current sensors and that the three phase voltages between the phases (a, b, and c) and the neutral point n, Van, Vbn, and Vcn, are measured by substation voltage instruments, for example, by the apparatus 260.

Figure 3:
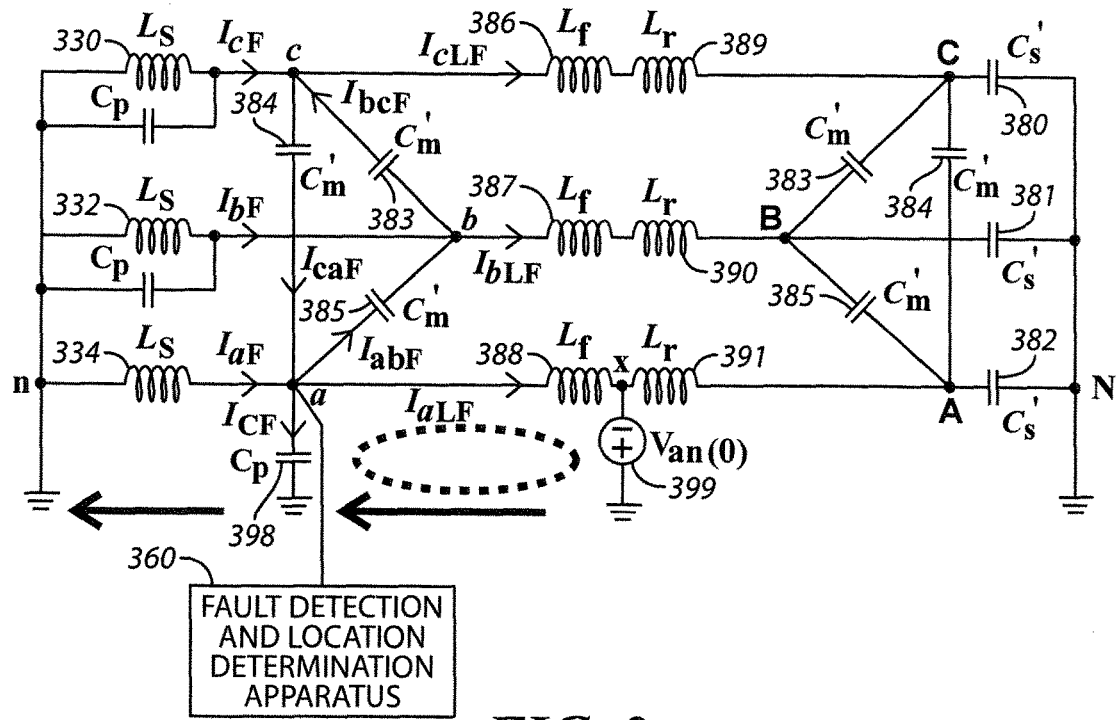
FIG. 3 comprises a diagram of an equivalent circuit for the three-phase circuit of FIG. 2 according to various embodiments of the present invention.

Application of the voltage injection to the fault location and deactivation of the sources and the superposition approach to the FIG. 2 circuit results in the equivalent circuit of FIG. 3. Like-numbered elements of FIG. 1 and FIG. 2 correspond to like-numbered elements in FIG. 3. Elements of FIG. 3 that have been already described with respect to FIG. 1 and/or FIG. 2 function in the same way as described elsewhere herein and will not be described again here.

As also described before and elsewhere herein, the magnitude of the voltage source at the fault location is the same as the voltage level at the moment of fault occurrence, Van(0) and labeled as 399. However, it should be understood that Van(0) can be replaced by a series of nominal voltage values for the duration of the self-clearing fault event. In other words, even though Van(0) is representatively described here and before as a single value at the fault inception time, it can be also indicated as the nominal voltage values of the phase over the duration of the fault.

Referring to FIG. 2 and FIG. 3, circuit elements and their relationship are described. Since the capacitor bank C is in parallel with Cs', a combined capacitance is Cp=C+Cs' (Cp is labeled 398), and since C is much bigger than Cs', the combined Cp may be approximated to C. The net fault currents in the phases (IaF, IbF, and IcF) and between phases (IabF, IbcF, and IcaF) are indicated along with the net fault line currents (IalF, IblF, and IclF). The net fault phase voltages, VaF, VbF, and VcF, are derived between the phases and the neutral point. The derivation of the net fault voltage for this cable circuit is similar to that as has been described above for the net fault current: the net fault voltage is determined by subtracting the voltage before the fault from the voltage during the fault.

The derivation of source impedance Ls is now discussed. Since the net fault voltage across the points a and n, VaF, is the same as the multiplication of Ls and the derivative of the net fault current IaF over time, VaF=−Ls*dIaF, the source impedance Ls is expressed as: Ls=−VaF/dIaF. In the formula, prefix d indicates differentiation (or derivative) and the dd double differentiation (or second derivative).

Derivation of the first and second derivatives is now described. The numerical differentiation of sampled signals can be derived from the definition that the first derivative of a time varying signal is the rate of change of the signal with time, which is interpreted as the slope of the tangent to the signal at each sample point. Assuming that the time interval between adjacent sample points, Δt, is constant, the simplest algorithm for computing a first derivative of a voltage V (represented as dV), for example, at sample time j is: dV(j)=[V(j+I)−V(j)]/Δt. The preceding differentiation algorithm is called the first order forward difference formula for first derivative. Alternatively, by applying a Taylor expansion, a second order centered difference formula for the first derivative can be obtained as: dV(j)=[V(j)+1)−V(j)−1)]/[2*Δt]. Still another alternative form of the first derivative, the fourth order approximation, can be obtained as: dV(j)= [V(j)−1)−8*V(j)−1)+8*V(j)+1)−V(j)+2)]/[12*Δt]. In one example, for the real data of 128 samples per cycle obtained from a substation, the second order first differentiation is typically found to be the best choice. However, this may not be true for other situations. Therefore, the proper order must be selected. The first derivative of net value process using the numerical first derivative method applies to all net fault voltages and currents. For second derivatives (ddV for example), a numerical method developed specifically for deriving a second order derivative directly from sampled signal can be applied; however, using the above-mentioned first derivative twice would be a convenient option. Since IaF is not a measured value, and only the net line fault current IalF is measured/derived, there must be a conversion to express Ls by the terms measured at the substation and/or derived thereafter. The conversion starts by considering three net fault line current equations at the substation side:

At node a: IalF=IaF−Cp*dVaF+Cm'*dVcaF− Cm'*dVabF.

At node b: IblF=IbF−Cp*dVbF+Cm'*dVabF− Cm'*dVbcF.

At node c: IclF=IcF−Cp*dVcF+Cm'*dVbcF− Cm'*dVcaF.

Addition of all three node equations leads to:

{IalF+IblF+IclF}={IaF+IbF+IcF}−Cp*{dVaF+ dVbF+dVcF}.

Differentiation of the above equation results in:

{dIalF+dIblF+dIclF}={dIaF+dIbF+dIcF}− Cp*{ddVaF+ddVbF+ddVcF}.

By using the relationships of VaF=−Ls*dIaF and the other two counterparts for phases b and c, the first bracket term of the right hand side of the above equation is replaced by:

−(1/Ls)*{dVaF+dVbF+dVcF}.

Therefrom, the source impedance formula is reached as:

Ls=−{VaF+VbF+VcF)}/{[dIalF+dIblF+dIclF]+Cp* [ddVaF+ddVbF+ddVcF]}.

Therefore, the source impedance formula is obtained by diving the sum of all three net fault voltages by the sum of the two terms, first the sum of all three derivatives of the net fault line currents and second, the multiplication of the capacitance and the sum of all three second derivatives of the net fault voltages, and then by negating the result.

The equations formulated in the derivation of the source impedance assume circuits whose paths are made through the earth (or ground) as well as circuit components as shown in FIG. 3. When a circuit path includes earth (or ground), a line impedance equation is usually compensated by a K-factor of residual compensation which is defined as the ratio of zero-sequence reactance (Xo) and the positive-sequence reactance (X1) at the substation: K=X0/X1. The final source impedance with the residual compensation (Lsk), therefore, has the following final formula: Lsk=Ls/K. The treatment of the final source impedance may be applied so that the value has a consistent and stabilized duration by applying the same smoothing and averaging of the smoothed values over the duration. It will be appreciated that the formula is expressed only with the measurable and derivable values at the substation.

The fault location formulation, which is used to calculate Lf, is described referring to FIG. 3. The formula for Lf is derived using only a part of FIG. 3 circuit which forms a loop made by Van(0), Lf, Cp, and the earth (ground). The voltage equation around the loop, marked by a dotted ellipse, is expressed by: Vaf=Lf*dIalF−Van(0). Then, the fault distance in terms of inductance, Lf, is formulated as: Lf={Van(0)+VaF}/{dIalF}. Hence, the impedance to the fault location is obtained by dividing the sum of the voltage level at the fault inception and the net fault voltage by the derivative of the net fault line current of the faulted phase. Applying the residual compensation likewise, the compensated distance to the fault in inductance has the following final formula: Lfk=Lf/K. As for the source impedance, the treatment of the final fault distance may be applied so that the value has a consistent and stabilized duration by using data smoothing method and averaging of the smoothed values over the duration. It will be appreciated that the formula for the fault location is expressed only with the measurable and derivable values at the substation.

The calculated distance to the fault (Lf) may be self-evaluated for its accuracy using the calculated source inductance (Ls), instead of using actual faulted data and the actual fault distance. This self-evaluation is possible because the formulas for LF and Ls contain the same variables. The variables contained in the formula for Ls, expressed as $Ls=-\{VaF+VbF+VcF\}/\{[dIalF+dIblF+dIclF]+Cp*[ddVaF+ddVbF+ddVcF]\}$, include the net fault voltage (and its double derivatives) and the derivative of the net fault current. On the other hand, the variables contained in the Lf formula, expressed as $Lf=\{-VaF+Van(0)\}/\{dIalF\}$, include the net fault voltage and the net fault current. The accuracy of the calculated source inductance Ls is closely linked to the accuracy of the calculated fault location. Therefore, the accurate calculated Ls may indicate that the calculated Lf is also accurate, without even testing with measured data.

There are various ways using the derived formulas for source impedance determination and fault location calculation in high-capacitance circuits. It will be appreciated that other examples are possible.

The determination of source impedance and the location of self-clearing transient faults may be realized in a stand-alone system, which receives voltage and current signals measured at the substation, analyzes the signals as described above herein, calculates the source impedance and the fault location, and sends out the result. The results may be presented at a display placed in to the stand alone system. The result may further be sent to utility power management systems such as SCADA (supervisory control and data acquisition), DMS (distribution management system), OMS (outage management system), DA (distribution automation), or other similar kind. The result may furthermore be sent to other intelligent devices, electronic or static, which may communicate the result to their upper layer system.

The approaches described herein for determining source impedance determination and the fault location calculation may be deployed at various locations with a circuit or system. For example, the above-mentioned approaches (e.g., using the formulas described above) may be implemented as computer code at an already existing computer/digital relay (i.e., a relay currently in service). In other words, a separate and new apparatus is not required. Currently existing relays in substations are typically installed to read the voltage and current signal and decide if the lines under their monitoring duties should stay energized or cut off. With the above-mentioned approaches implemented as computer code in these relays, the relays would provide additional function of fault location and source impedance determination.

The approaches described herein may also be implemented as computer code executed by a processing device that is part of a power management system such as DMS, OMS, or DA (to mention a few examples). In this respect, the computer code that implements the above-mentioned formulas becomes a part of the system. Signal data is read using the mechanism already built into the power management systems. The data is analyzed for the calculation of source impedance and fault location by which the power management system can provide additional function of fault location.

The approaches described herein may also be implemented at a computer network server. The server may be connected via a network with remotely located power management systems. In this respect and in one aspect, the server receives signal data from the power management systems, analyzes the data, calculates the source impedance and fault location, and transmits the result to the power management systems. This server-based system enables the calculation of source impedance and fault location of any electric network so long as the network signal data can be transmitted to the server (e.g., to the server via a power management system or by any means available to the server). In this respect, any power management system (or any other appropriate system), when appropriate, can send the network signal data to the server and the source impedance and self-clearing fault location may be calculated. The transient fault location information may be used to arrange preventive maintenance and repair activities before the transient sub-cycle fault condition leads to a permanent fault and unscheduled outages.

Figure 4:
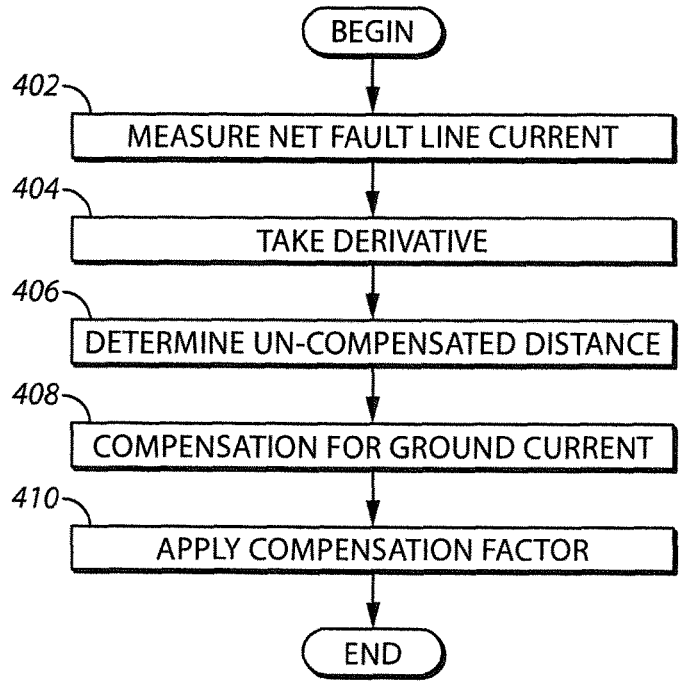
FIG. 4 comprises a flow chart an approach for determining fault location according to various embodiments of the present invention.

Referring now to FIG. 4, one example of an approach for determining fault location is described. At step 402, the net fault line current is measured at a measurement point in a three-phase circuit. The measurement point is located at an output of a power sub-station and the faulted three phase circuit has a loop circuit having an associated net fault line current and a ground current.

At step 404, a derivative of the net fault line current of the loop circuit as measured from the measurement point is calculated. At step 406, an uncompensated distance to the sub-cycle fault using at least the derivative of the net fault current is determined. At step 408, the process is configured to compensate for the ground current of the loop circuit.

At step 410, the compensation is applied to the uncompensated distance to produce a compensated distance to the sub-cycle fault. The compensated distance may be measured in inductance units.

Figure 5:
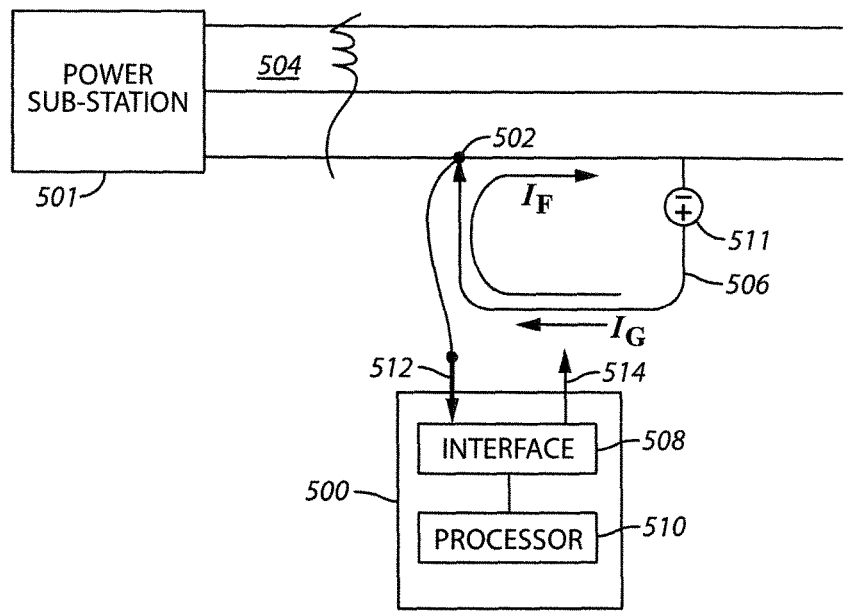
FIG. 5 comprises a block diagram of an apparatus for determining fault location according to various embodiments of the present invention.

Referring now to FIG. 5, one example of an apparatus 500 for determining fault location is described. The apparatus 500 is configured to determine a distance from a measurement point 502 to a fault 511 (here represented as a voltage source) in a three-phase circuit 504. The circuit 504 has a loop circuit 506 with an associated ground current Ig and net fault current If. The apparatus 500 includes an interface 508 and a processor 510. It will be appreciated that for simplicity the connection is shown as to being made to only one phase of the three phase circuit, but that connections to the other phases may also be made.

The interface 508 has an input 512 and an output 514. The processor 510 is coupled to the interface 508 and configured to calculate a derivative of the net fault line current received at the input 512 of the interface 508 and determine an uncompensated distance to the sub-cycle fault using the derivative. The processor 510 is further configured to compensate for the ground current and apply the compensation to the uncompensated distance to produce a compensated distance to the fault for presentation at the output 514 of the interface 508.

In some aspects, the apparatus 500 is at least partially disposed with an existing power management system deployed at the power sub-station 501. In other examples, the apparatus 500 communicates with a sensor at the measurement point via a communication network.

In yet other aspects, the processor 510 is further configured to determine a source inductance and the source inductance is measured from the measurement point looking back at the sub station 501. In still other examples, the processor 510 is further configured to determine a fault location accuracy based at least upon the determined source inductance.

Figure 6:
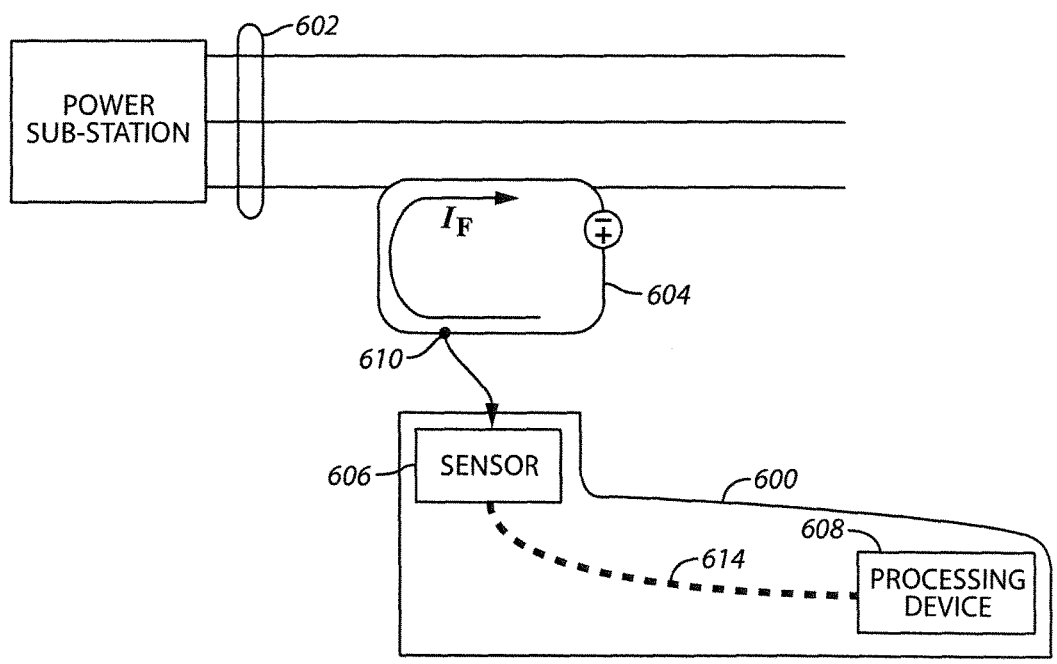
FIG. 6 comprises a block diagram of a system and apparatus for determining fault location according to various embodiments of the present invention.

Referring now to FIG. 6, one example of a system for determining a fault location is described. An apparatus 600 is configured to determine a distance from a measurement point to a fault in a three-phase circuit 602. The circuit 602 under fault condition has a loop circuit 604 with an associated ground current and net fault current. The apparatus includes a sensor 606 and a processing device 608. It will be appreciated that for simplicity the connection is shown as to being made to only one phase of the three phase circuit, but that connections to the other phases may also be made.

The sensor 606 measures the line current and derives the net fault line current If the loop circuit 604 and is deployed at the measurement point 610 located at an output of a power sub-station 612. The processing device 608 is coupled to the sensor and configured to calculate a derivative of the net fault line current and determine an uncompensated distance to the sub-cycle fault using the derivative. The processing device 608 is further configured to compensate for the ground current and apply the compensation factor to the uncompensated distance to produce a compensated distance to the fault.

As shown here, the processing device 608 is located at a different location than the sensor. The sensor and the processing device 608 are coupled via a communication network 614. For example, the processing device 608 may be located at a server. In other aspects, the processing device 608 may be located at a power management system located at the power management system. In yet other aspects, the processing device is located at a relay (as is the sensor 606).

In yet other aspects, the processing device 608 is further configured to determine a source inductance. The source inductance is measured from the measurement point 610 looking back at the sub station 612. The source inductance is determined according to at least capacitance. The processing device 608 is further configured to determine fault location accuracy based at least upon the determined source inductance.

While the invention herein disclosed has been described by means of specific embodiments and applications thereof, numerous modifications and variations could be made thereto by those skilled in the art without departing from the scope of the invention.

What is claimed is:

1. A method comprising:
selecting a measurement point to a fault in a three-phase circuit, the measurement point being located at an output of a power sub-station, the three-phase circuit having a loop circuit with an associated net fault line current and a ground current;
electrically connecting a current sensor to the measurement point at the output of the power substation;
selectively sensing the net fault line current using the current sensor and transmitting the sensed net fault line current to an electronic server over a network;
at the electronic server, receiving the sensed net fault line current from the network and taking a derivative of the net sensed fault line current of the loop circuit as measured from the measurement point and determining an uncompensated inductive distance to the sub-cycle fault by obtaining a sum of a voltage level at the fault and a net fault voltage, and dividing the sum by the derivative of the net fault current;
at the electronic server, determining a compensation inductive distance to account for the ground current of the loop circuit;
at the electronic server, applying the compensation inductive distance to the uncompensated inductive distance to produce a compensated inductive distance to the sub-cycle fault;
at the electronic server, determining a source inductance, the source inductance being measured from the measurement point looking back at the sub-station;
at the electronic server, determining an accuracy of the calculated distance to the fault based upon the determined source inductance and without the use of faulted data;
at the electronic server and based upon the calculated distance to the fault, determining and arranging a preventive maintenance and repair activity before the sub-cycle fault leads to an unscheduled fault and an unscheduled outage.

2. The method of claim 1 wherein the compensated inductive distance is measured in inductance units.

3. The method of claim 1 wherein the sensing is performed using an existing power management system deployed at power sub-station.

4. The method of claim 1 wherein the source inductance is determined according to at least one capacitance.

5. The method of claim 1 further comprising displaying the fault distance to a user.

6. An apparatus comprising:
a three-phase circuit, the three-phase circuit including a loop circuit with an associated ground current and net fault current;
a measurement point associated with a fault in the three-phase circuit;
a sensor, the sensor for measuring the net fault line current of the loop circuit, the sensor being electrically connected to the measurement point located at an output of a power sub-station, the sensor configured to transmit the sensed net fault line current to an electronic server over a network;
an electronic server that includes a processing device, the electronic server coupled to the sensor via the network, the processing device configured to calculate a derivative of the net fault line current and determine an uncompensated inductive distance to the sub-cycle fault by obtaining a sum of a voltage level at the fault and a net fault voltage, and dividing the sum by the derivative, the processing device further configured to determine a compensation inductive distance to compensate for the ground current and apply the compensation inductive distance to the uncompensated inductive distance to produce a compensated inductive distance to the fault;
wherein the processing device is configured to determine a source inductance, the source inductance being measured from the measurement point looking back at the sub-station;
wherein the processing device is configured to determine an accuracy of the calculated distance to the fault based upon the determined source inductance and without the use of faulted data;
wherein based upon the calculated distance to the fault, the processing device is configured to determine and arrange a preventive maintenance and repair activity before the sub-cycle fault leads to an unscheduled fault and an unscheduled outage.

7. The apparatus of claim 6 wherein the processing device is located at a different location than the sensor and where the sensor and the processing device are coupled via the communication network.

8. The apparatus of claim 6 wherein the source inductance is determined according to at least one capacitance.

9. An apparatus comprising:
- an interface, the interface having an input and an output;
- a processor, the processor coupled to the interface, and wherein the interface and the processor are disposed at an electronic server and connected to a three-phase the three-phase circuit via a network, the three-phase circuit including a loop circuit with an associated ground current and net fault line current, wherein the net fault line current is transmitted to the electronic server over the network;
- wherein the processor is configured to calculate a derivative of the net fault line current received at the input of the interface and obtained by a sensor that is electrically coupled to a measurement point within the three-phase circuit, and determine an uncompensated inductive distance to the sub-cycle fault by obtaining a sum of a voltage level at the fault inception and a net fault voltage, and dividing the sum by the derivative, the processor further configured to determine a compensation inductive distance to compensate for the ground current and apply the compensation inductive distance to the uncompensated inductive distance to produce a compensated inductive distance to the fault for presentation at the output of the interface;
- wherein the processor is configured to determine a source inductance, the source inductance being measured from the measurement point looking back at the sub-station;
- wherein the processor is configured to determine an accuracy of the calculated distance to the fault based upon the determined source inductance and without the use of faulted data;
- wherein the processor is configured to determine and arrange a preventive maintenance and repair activity before the sub-cycle fault leads to an unscheduled fault and an unscheduled outage.

10. The apparatus of claim 9 wherein the apparatus communicates with a sensor at the measurement point via the network.

* * * * *

UNITED STATES PATENT AND TRADEMARK OFFICE
CERTIFICATE OF CORRECTION

PATENT NO. : 9,696,367 B2  Page 1 of 1
APPLICATION NO. : 13/469208
DATED : July 4, 2017
INVENTOR(S) : Charles J. Kim It is certified that error appears in the above-identified patent and that said Letters Patent is hereby corrected as shown below:

In the Claims

Claim 7, Column 10, Line 67; Delete "communication".

Claim 9, Column 11, Line 7; Delete "three-phase the".

Signed and Sealed this
Twenty-third Day of January, 2018

Joseph Matal
*Performing the Functions and Duties of the
Under Secretary of Commerce for Intellectual Property and
Director of the United States Patent and Trademark Office*